(12) United States Patent
Stoehr et al.

(10) Patent No.: US 9,173,318 B2
(45) Date of Patent: Oct. 27, 2015

(54) CIRCUIT HOUSING HAVING A PRINTED CIRCUIT BOARD WHICH IS POSITIONED IN SAID CIRCUIT HOUSING BY MEANS OF POSITIONING ELEMENTS

(75) Inventors: Rainer Stoehr, Foertiz (DE); Stefan Regn, Neuhaus (DE); Fabian Kaptur, Jagstzell (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 330 days.

(21) Appl. No.: 13/821,496

(22) PCT Filed: Sep. 6, 2011

(86) PCT No.: PCT/EP2011/065363
§ 371 (c)(1),
(2), (4) Date: Sep. 12, 2013

(87) PCT Pub. No.: WO2012/032027
PCT Pub. Date: Mar. 15, 2012

(65) Prior Publication Data
US 2013/0343017 A1 Dec. 26, 2013

(30) Foreign Application Priority Data

Sep. 9, 2010 (DE) .......................... 10 2010 044 909

(51) Int. Cl.
*H05K 5/00* (2006.01)
*H05K 7/14* (2006.01)

(52) U.S. Cl.
CPC .............. *H05K 7/1427* (2013.01); *H05K 5/006* (2013.01); *H05K 7/142* (2013.01); *H05K 2201/09063* (2013.01); *H05K 2203/167* (2013.01)

(58) Field of Classification Search
CPC .................................... H05K 5/00; H05K 7/14
USPC ........................................................... 361/810
See application file for complete search history.

(56) References Cited

U.S. PATENT DOCUMENTS 4,672,732 A 6/1987 Ramspacher et al.
5,979,037 A * 11/1999 Lopez .............................. 29/525
(Continued)

FOREIGN PATENT DOCUMENTS

CN 1516545 7/2004
DE 20 2008 008 286 3/1992
(Continued)

OTHER PUBLICATIONS

International Search Report for PCT/EP2011/065363, dated Sep. 6, 2011.
(Continued)

*Primary Examiner* — Forrest M Phillips
(74) *Attorney, Agent, or Firm* — Kenyon & Kenyon LLP

(57) ABSTRACT

A circuit housing having a printed circuit board and a circuit and holes in which peg-like positioning elements projecting away from the housing engage for positioning the PCB relative to the housing, at least one positioning element projecting without play into one circular hole, another positioning element, accommodated in another hole, having spreading fingers separated from one another by at least one recess, projecting into/through the further hole, elastically transverse to the direction of an imaginary connecting line of the holes and a cross-section such that a) in the direction of the imaginary connecting line, there is play between the spreading fingers and a radially inner circumferential surface of the another hole on both sides, but b) the spreading fingers make contact by their diametrically opposite side faces with the inner face of the another hole perpendicular to the connecting line without play only along a contact line/point.

18 Claims, 4 Drawing Sheets

(56) References Cited

U.S. PATENT DOCUMENTS

| | | | | |
|---|---|---|---|---|
| 2006/0120060 A1* | 6/2006 | Boudreaux et al. | ........... | 361/809 |
| 2007/0064405 A1* | 3/2007 | Chen | ............... | 361/810 |
| 2008/0019110 A1* | 1/2008 | Gilliland et al. | .............. | 361/810 |
| 2008/0165510 A1* | 7/2008 | Nishimoto et al. | ........... | 361/752 |
| 2008/0304244 A1* | 12/2008 | Hsieh | ............ | 361/810 |
| 2009/0196004 A1* | 8/2009 | Ogatsu et al. | ................. | 361/810 |

FOREIGN PATENT DOCUMENTS

| DE | 91 15 131 | 3/1992 |
|---|---|---|
| DE | 103 48 979 | 2/2005 |

OTHER PUBLICATIONS

European Patent Office, International Preliminary Report on Patentability, Mar. 12, 2013, from International Patent Application No. PCT/EP2011/065363, filed on Sep. 6, 2011.

European Patent Office, English Translation of International Preliminary Report on Patentability, Mar. 12, 2013, from International Patent Application No. PCT/EP2011/065363, filed on Sep. 6, 2011.

\* cited by examiner

CIRCUIT HOUSING HAVING A PRINTED CIRCUIT BOARD WHICH IS POSITIONED IN SAID CIRCUIT HOUSING BY MEANS OF POSITIONING ELEMENTS

FIELD OF THE INVENTION

The present invention relates to a circuit housing having at least one printed circuit board which is arranged in said circuit housing and has an electrical circuit and at least two holes in which peg-like positioning elements which project away from the circuit housing engage at least for the purpose of positioning the printed circuit board relative to the circuit housing, wherein at least one positioning element from amongst the positioning elements projects without play into one circular hole in the printed circuit board.

BACKGROUND INFORMATION

A circuit housing of this generic type is discussed in DE 20 2008 008 286 U1 in which peg-like positioning elements which are formed on the circuit housing and have a circular cross section project into associated bore holes in the printed circuit board.

Electronic controllers of vehicles, such as brake controllers, motor controllers and the like, usually have a large number of electrical plug contacts which are, for example, injection-molded into the circuit housing as part of an injection-molding process or are stitched into said circuits and the ends of which have to be soldered or pressed into openings or contact points of a printed circuit board. In this case, the position of the printed circuit board relative to the circuit housing is critical since, if printed circuit boards are incorrectly positioned, the electrical plug contacts which project away from the base of the circuit housing are no longer in alignment with the associated openings in or contact points on the printed circuit board. Therefore, high requirements are made of the tolerances of the printed circuit board and the positioning elements on the circuit housing, these having proven to be problematical to comply with and expensive to produce, particularly when the printed circuit board and the circuit housing have large dimensions.

SUMMARY OF THE INVENTION

In contrast, the invention is based on the object of developing a circuit housing having at least one printed circuit board, which is arranged in said circuit, of the kind mentioned in the introductory part in such a way that it is possible to position the printed circuit board on or in the circuit housing in as accurate a manner as possible with high tolerance requirements.

The present invention is based on the idea of a further positioning element, which is accommodated in a further hole in the printed circuit board, having spreading fingers which are separated from one another by at least one recess, project into or through the further hole, are configured to be elastic transverse to the direction of an imaginary connecting line of the holes and have a cross section of such a kind that a) as seen in the direction of the imaginary connecting line, there is play between said spreading fingers and a radially inner circumferential surface of the further hole on both sides in each case, b) but said spreading fingers make contact by way of their diametrically opposite side faces with the radially inner circumferential face of the further hole perpendicular to the imaginary connecting line without play only along a contact line or a contact point in each case.

Overall, the degree of rotational freedom of the printed circuit board in relation to the circuit housing, which would be produced by the interaction between one positioning element and one hole, is therefore inhibited by the interactions between the further positioning element and the further hole by the further positioning element being accommodated without play or with a press fit in the further hole perpendicular to the connecting line. In contrast, accommodating the further positioning element in the further hole, as seen in the direction of the connecting line, with play allows for tolerance compensation.

The advantages which can be achieved with these measures are that the printed circuit board would then initially be mounted on the one positioning element, which projects into the one circular hole, such that it can rotate about this one positioning element in a plane perpendicular to the one positioning element and that this degree of rotational freedom perpendicular to the connecting line is inhibited by the further positioning element being accommodated without play in the further hole. Since the further positioning element additionally has a cross section which differs from a circular cross section and, at the same time, there is still in each case a distance (play) from the radially inner circumferential faces of the further hole on both sides of the spreading fingers of this positioning element, tolerance compensation can take place, as seen in the direction of the connecting line between the two holes, in particular by the further positioning element being able to move relative to the further hole with elastic deformation of the spreading fingers and with a reduction in the size of the recess between the spreading fingers, as seen along the imaginary connecting line. This ability of the further positioning element to move within the further hole then provides tolerance compensation if the electrical plug contacts which project away from the base of the housing part are not in exact alignment with the openings in the printed circuit board.

Therefore, instead of not providing an elongate hole, which would have had to be milled in the printed circuit board, as a further hole, as is customary for tolerance compensation in the prior art, it is rather possible to provide said further hole, like the one hole, likewise as a hole with a circular cross section which, in contrast, is easier to produce by drilling.

This configuration is possible because the spreading fingers make contact with the radially inner circumferential face of the further circular hole only by way of a contact line or by way of a contact point, instead of by way of its entire circumferential face. By way of example, the cross section, which is formed by the two spreading fingers together, is substantially elliptical, wherein contact is then made with the radially inner circumferential face of the further hole at the major axis of the ellipse.

Advantageous developments of and improvements to the invention specified in claim 1 are possible by virtue of the measures cited in the dependent claims.

As already mentioned above, provision is made, according to a particular embodiment, for the further hole to have a circular cross section with a diameter which is smaller than the distance between the contact lines or contact points perpendicular to the imaginary connecting line. A press fit is then established between the further positioning element and the further hole in a direction perpendicular to the connecting line. As an alternative, the further hole could also be in the form of an elongate hole.

According to one development, at least the further hole can be in the form of a passage hole and the recess between the spreading fingers of the further positioning element, as seen in the axial direction of the further hole, can extend slightly beyond an upper and a lower face of the printed circuit board. In this case, the spreading fingers are easily able to move in order to compensate for possible tolerances.

By way of example, at least one of the positioning elements, together with the circuit housing, is in the form of an integral plastic injection-molded part.

The printed circuit board, in the situation in which it is positioned on the positioning elements, may be supported on at least three support faces of the bearing housing. In order to guarantee support which is as flat as possible without tilting, said support faces are arranged as far away from one another as possible. If the extent of the support faces is selected to be small, the position of said support faces within the injection-molding tool can be easily changed, as a result of which very narrow tolerances in respect of the levelness of their position can be achieved.

According to a further measure, the spreading fingers of the further positioning element are stressed with elastic prestress against the radially inner circumferential face of the further hole. This results in a play-free, frictionally engaging connection in the form of a press fit being established between the further positioning element and the further hole, it then being possible for said connection to take on a mounting function in addition to positioning the printed circuit board relative to the circuit housing.

Therefore, the one positioning element may also have at least three spreading fingers, the outer faces of said spreading fingers which face the radially inner circumferential face of the one hole being enclosed by an imaginary cylindrical surface in a contact region and said spreading fingers being stressed with elastic prestress against the radially inner circumferential face of the one hole. This one hole or this one positioning element is then play-free in contrast to the further positioning element which can move within the further hole, but only in the direction of the imaginary connecting line between the holes, for tolerance compensation.

The above-described effects according to the invention occur when at least one of the holes is in the form of a passage hole.

Further measures which improve the invention will be illustrated in greater detail below, together with the description of the exemplary embodiments of the invention, with reference to the drawing.

DETAILED DESCRIPTION

Figure 1:
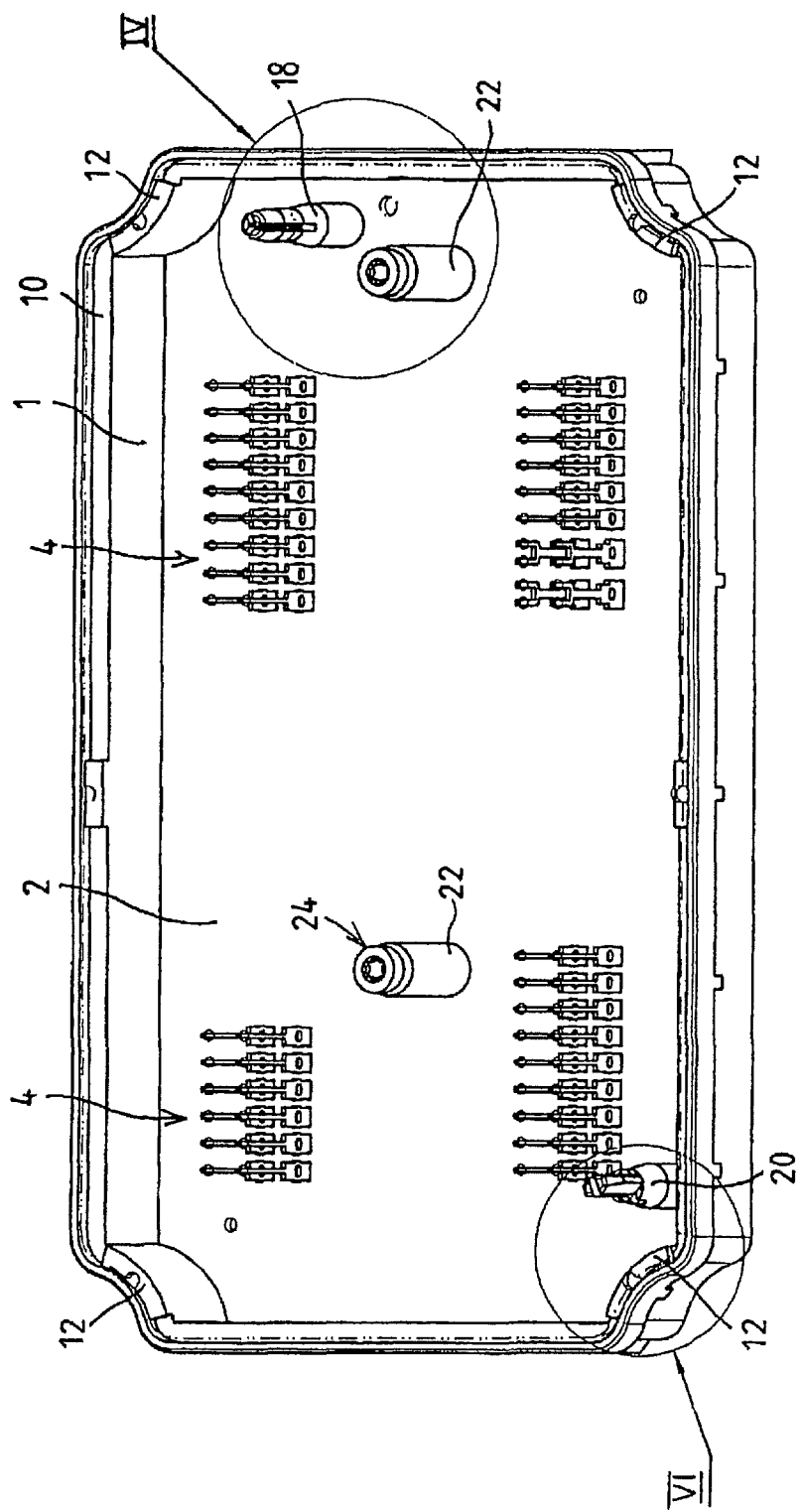
FIG. 1 shows a perspective view of a circuit housing having positioning elements according to an exemplary embodiment of the invention.

FIG. 1 shows a circuit housing of a controller of a vehicle, more precisely a lower, dish-like housing part 1 which forms the circuit housing when combined with a further upper housing part—not shown here. Electrical plug contacts 4 project away from a base 2 of the lower housing part 1, said electrical plug contacts being intended to be inserted into openings 6 in a printed circuit board 8 and, for example, then soldered or pressed-in without soldering ("stitched"). The printed circuit board 8 is placed on a support faces 12, which are formed at the upper edge of the housing part 1, and on screw bosses 22. In order to guarantee as flat a support as possible without tilting, the support faces 12 are arranged as far away from one another as possible.

Figure 2:
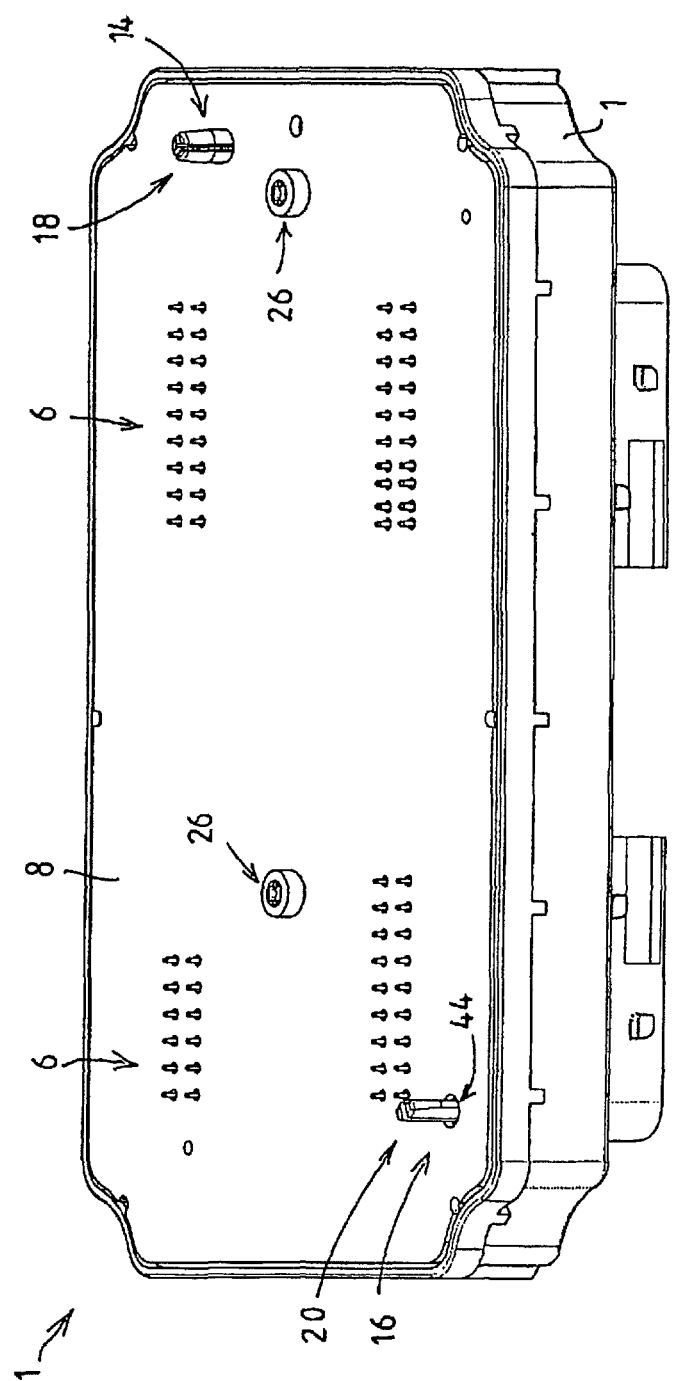
FIG. 2 shows a perspective view of the circuit housing of FIG. 1 with a printed circuit board which is positioned above the positioning elements.

As shown in FIG. 2, the printed circuit board 8 has, in addition to the openings 6 for the electrical plug contacts 4, an electrical circuit—not explicitly shown here—and, for example, two holes 14, 16 in which peg-like positioning elements 18, 20 which project upward away from the base 2 of the housing part 1 engage in the joining plane at least for the purpose of positioning the printed circuit board 8 relative to the housing part 1.

Figure 3:
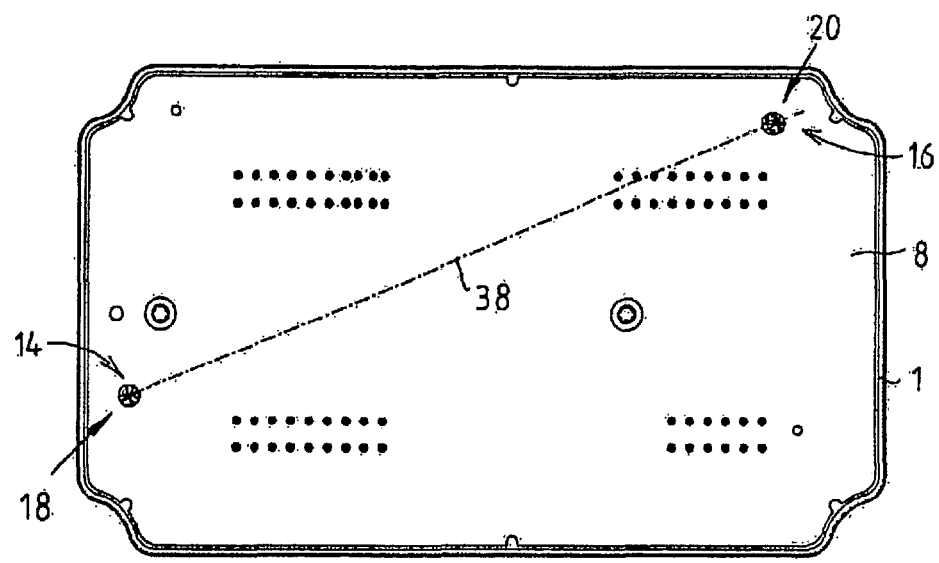
FIG. 3 shows a plan view of the circuit housing with the printed circuit board of FIG. 2 fitted.

The printed circuit board 8 has, like the housing part 1, a substantially rectangular cross section, wherein the holes 14, 16 for the positioning elements 18, 20 are situated substantially in the vicinity of a diagonal of the printed circuit board 8 so that they are at the greatest possible distance from one another, as shown in FIG. 3.

The two holes 14, 16 may have a circular cross section and may be in the form of passage holes, with the result that the positioning elements 18, 20 project through them. The holes 14, 16 could also be in the form of elongate holes.

Furthermore, the two peg-like positioning elements 18, 20, together with the housing part 1, are, for example, in the form of an integral plastic injection-molded part (FIG. 1). As an alternative, they could also form separate parts which are connected to corresponding receptacles in the housing part 1 in a cohesive, frictionally engaging and/or interlocking manner.

In addition, mounting bosses 22 project upward from the base of the housing part and have openings 24 which are provided for the engagement of, for example, screws which project through corresponding holes 26 in the printed circuit board 8 in order to secure the printed circuit board 8 to the support faces of the screw bosses 22, as can be easily imagined on the basis of FIG. 1 and FIG. 2.

Figure 4:
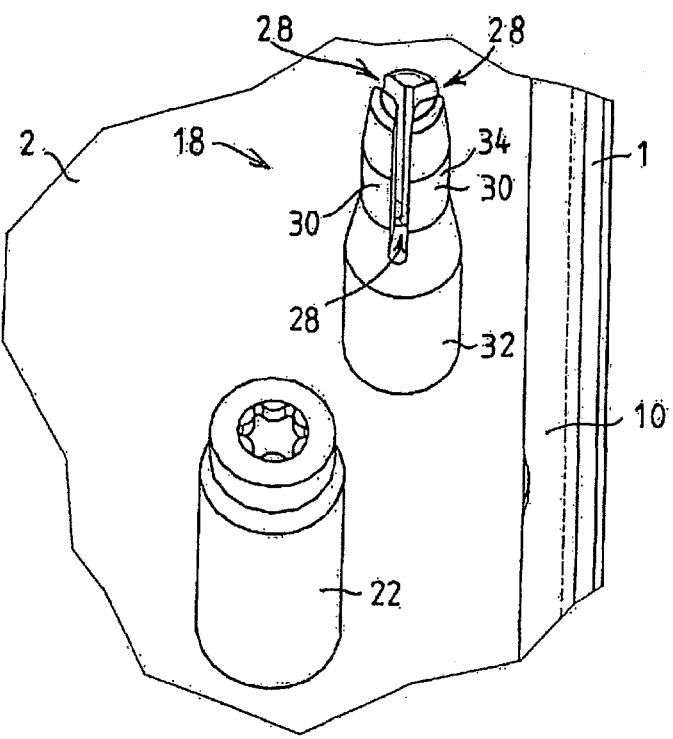
FIG. 4 shows a perspective view of a positioning element.
Figure 5:
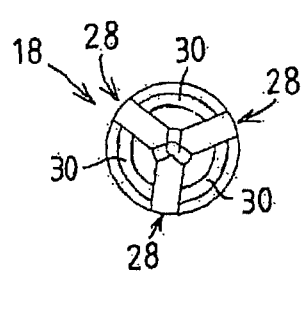
FIG. 5 shows a plan view of the positioning element of FIG. 4.

As shown in FIG. 4 and FIG. 5, the one positioning element 18 particularly may have at least three spreading fingers 30 which are separated by groove-like recesses 28, wherein the cross section which is formed by said spreading fingers tapers conically, for example in a step-like manner, starting from the housing-end peg-like base 32 of the, to its free end. In the contact region 34 with the one hole 14, this cross section may be cylindrical with a constant diameter, wherein the spreading fingers 30 then form cylindrical segments in the contact region 34, said cylindrical segments being enclosed by an imaginary cylindrical surface (FIG. 4).

In the contact region 34, the outer faces of the spreading fingers 30 are stressed with elastic prestress against the radially inner circumferential face of the one hole 14 (FIG. 2). In other words, when the one positioning element 18 is in the state in which it is inserted into the one hole 14, the inside diameter of the one hole 14 is somewhat smaller than the outside diameter of the imaginary cylindrical surface which encloses the spreading fingers 38 in the contact region 34. Therefore, the one positioning element 18 projects through the one hole 14 in the manner of a press fit, wherein the spreading fingers 30 spring elastically inward with a reduction in size of the recesses 28, as also disclosed in FIG. 8 in particular.

Figure 6:
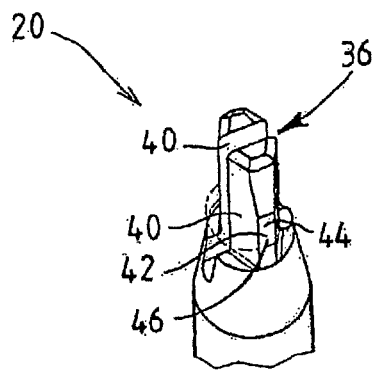
FIG. 6 shows a perspective view of a further positioning element.
Figure 7:
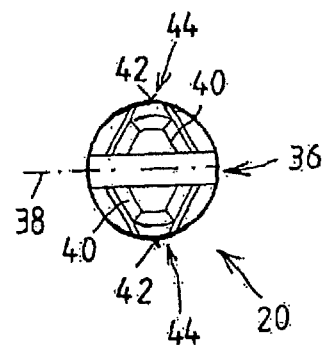
FIG. 7 shows a plan view of the positioning element of FIG. 6.

As shown in FIG. 6 and FIG. 7, the further positioning element 20 which projects through the further, which may be circular hole 16 may have two spreading fingers 40 which are separated from one another by, for example, a groove-like recess 36 and are elastic transverse to the direction of an imaginary connecting line 38 of the two holes 14, 16 (FIG. 3).

These two spreading fingers 40 have a cross section of such a kind that, as seen in the direction of the imaginary connecting line 38, there is a distance (see FIG. 2) between said spreading fingers and a radially inner circumferential surface of the further hole 16 on both sides in each case, and said spreading fingers make contact by way of their diametrically opposite side faces 42 with the radially inner circumferential face of the further hole 16 perpendicular to the imaginary connecting line 38 without play only along a contact line 44 or a contact point in each case. By way of example, the cross section which is formed by the two spreading fingers with one another in a contact region 46 with the further hole 16 is substantially elliptical, as indicated in FIG. 7, wherein contact is then made with the radially inner circumferential face of the further hole 16 at the major axis of the ellipse in a spherical region 44 in a line or at a point.

Figure 8:
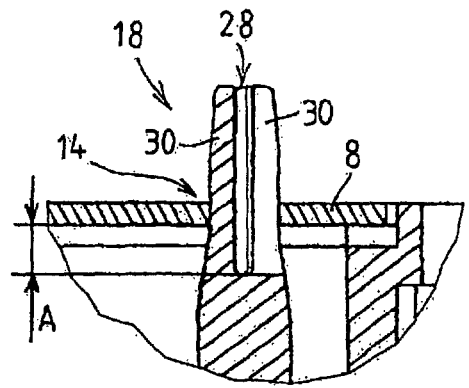
FIG. 8 shows a cross-sectional illustration of the positioning element of FIG. 5.

Furthermore, in the case of the one positioning element 18, as in the case of the further positioning element 20, the recess 28, 36 between the spreading fingers 30, 40 extends slightly beyond an upper and a lower face of the printed circuit board 8, as seen in the axial direction of the holes 14, 16, as shown in FIG. 2 and FIG. 8. The base of the recesses 28, 36 is, for example, at a distance A from the lower face of the printed circuit board 8, as shown in FIG. 8.

Furthermore, the spreading fingers 40 of the further positioning element 20 are stressed with elastic prestress against the radially inner circumferential surface of the further hole 16. In other words, the inside diameter of the further hole 16 in the contact region 46 is somewhat smaller than the major axis of the elliptical cross section. This results in a play-free frictionally engaging connection in the form of a press fit being established between the further positioning element 20 and the further hole 16 transverse to the connecting line 38, said connection also taking on a mounting function in addition to positioning the printed circuit board 8 relative to the housing part 1. In addition, the spreading fingers 40 of the further positioning element 20 in its end region which projects beyond the contact region 46 may taper conically in cross section, in order to facilitate insertion into the further hole 16.

Since the further positioning element 20 has a cross section which differs from a circular cross section and, at the same time, there is still in each case a distance from the radially inner circumferential face of the further hole 16 on both sides of the spreading fingers 40 as seen in the direction of the connecting line 38, tolerance compensation can take place, as seen in the direction of the connecting line 38, in particular by the further positioning element 20 being able to move relative to the further hole 16 with elastic deformation of the spreading fingers 40 and with a reduction in the size of the recess 36 between the spreading fingers 40, as seen along the imaginary connecting line 38.

This ability of the further positioning element 20 to move within the further hole 16 or vice versa provides tolerance compensation which is necessary on account of the distance tolerances from hole 14 to hole 16 and from positioning element 18 to positioning element 20.

The position of the positioning element 18 with the associated play-free hole 14 in the printed circuit board 8 and the direction to the further positioning element 20 with the associated hole 16 or elongate hole 16 form the basis of a coordinate system for positioning the openings 6 in the printed circuit board 8 to the associated plug contacts 4 in the base 2 of the housing part 1. This reduces the tolerances of the components when assembling the assembly.

The further hole 16 could therefore also be in the form of an elongate hole instead of having a circular cross section, wherein there is then likewise contact along a contact line or at a contact point. The frictionally engaging connections by virtue of a press fit between the positioning elements 18, 20 and the holes 14, 16 likewise makes a contribution to mounting the printed circuit board 8 on the housing part 1. In an extreme case, the additional screw connections could be dispensed with.

LIST OF REFERENCE SYMBOLS

1 Housing part
2 Base
4 Plug contacts
6 Openings
8 Printed circuit board
10 Step
12 Support faces
14 Hole
16 Hole
18 Positioning element
20 Positioning element
22 Mounting bosses
24 Openings
26 Holes
28 Recesses
30 Spreading finger
32 Base
34 Contact region
36 Recess
38 Connecting line
40 Spreading finger
42 Side face
44 Contact line
46 Contact region

The invention claimed is:

1. A circuit housing, comprising:
a circuit housing arrangement;
at least one printed circuit board in the circuit housing arrangement and having an electrical circuit and at least two circular holes in which peg-like positioning elements, which project away from the circuit housing arrangement, engage at least for positioning the printed circuit board relative to the circuit housing arrangement, wherein at least one of the positioning elements projects without play into one of the circular holes; and
a further positioning element, which is accommodated in a further hole, has spreading fingers which are separated from one another by at least one recess, and which projects into or through the further hole, and which are configured to be elastically transverse as to the direction of an imaginary connecting line of the holes and have a cross-section such that: a) as seen in the direction of the imaginary connecting line, there is play between the spreading fingers and a radially inner circumferential surface of the further hole on both sides in each case, but b) the spreading fingers make contact by way of their diametrically opposite side faces with the radially inner circumferential face of the further hole perpendicular to the imaginary connecting line without play only along a contact line or a contact point in each case;

wherein the further positioning element has spreading fingers which are separated from one another and are elastic transverse to the direction of an imaginary connecting line of the two holes.

2. The circuit housing of claim 1, wherein the further hole has a circular cross section with a diameter which is smaller than the distance between the contact lines or contact points perpendicular to the imaginary connecting line.

3. The circuit housing of claim 1, wherein the further hole is in the form of an elongate hole.

4. The circuit housing of claim 1, wherein at least the further hole is in the form of a passage hole and the recess between the spreading fingers of the further positioning element, as seen in the axial direction of the further hole, extends beyond an upper face and a lower face of the printed circuit board.

5. The circuit housing of claim 1, wherein at least one of the positioning elements, together with the circuit housing arrangement, is in the form of an integral plastic injection-molded part.

6. The circuit housing of claim 1, wherein the printed circuit board, in the situation in which it is positioned on the positioning elements, is supported on at least three support faces of the circuit housing arrangement.

7. The circuit housing of claim 1, wherein the spreading fingers of the further positioning element are stressed with elastic prestress against the radially inner circumferential face of the further hole.

8. The circuit housing of claim 1, wherein the printed circuit board is held on or in the circuit housing arrangement by at least one of (i) the positioning elements, which are held in a frictionally engaging manner with in the associated holes, and (ii) by an additional connecting arrangement.

9. The circuit housing of claim 1, wherein the holes are at the greatest possible distance from one another in relation to the flat extent of the printed circuit board.

10. The circuit housing of claim 1, wherein one of the positioning elements has at least three spreading fingers, the outer faces of the spreading fingers which face the radially inner circumferential face of the one hole being enclosed by an imaginary cylindrical surface in a contact region and the spreading fingers being stressed with elastic prestress against the radially inner circumferential face of the one hole.

11. The circuit housing of claim 1, wherein at least one of the holes is in the form of one of a passage hole and a blind hole.

12. The circuit housing of claim 1, wherein the printed circuit board, in the situation in which it is positioned on the positioning elements, is supported on at least three support faces of the circuit housing arrangement, and wherein at least one of the support faces corresponds to an inside edge of the circuit housing arrangement.

13. The circuit housing of claim 1, wherein the printed circuit board, in the situation in which it is positioned on the positioning elements, is supported on at least three support faces of the circuit housing arrangement, and wherein at least two of the support faces correspond to an inside edge of the circuit housing arrangement.

14. The circuit housing of claim 1, wherein the printed circuit board, in the situation in which it is positioned on the positioning elements, is supported on at least three support faces of the circuit housing arrangement, and wherein at least three of the support faces correspond to an inside edge of the circuit housing arrangement.

15. The circuit housing of claim 1, wherein the printed circuit board, in the situation in which it is positioned on the positioning elements, is supported on at least three support faces of the circuit housing arrangement, and wherein at least four of the support faces correspond to an inside edge of the circuit housing arrangement.

16. The circuit housing of claim 1, wherein the further positioning element has two spreading fingers which are separated from one another by a groove-like recess and are elastic transverse to the direction of an imaginary connecting line of the two holes.

17. The circuit housing of claim 1, wherein the two spreading fingers have a cross section such that, as seen in the direction of the imaginary connecting line, there is a distance between the spreading fingers and a radially inner circumferential surface of the further hole on both sides in each case, and the spreading fingers make contact by way of their diametrically opposite side faces with the radially inner circumferential face of the further hole perpendicular to the imaginary connecting line without play only along a contact line or a contact point in each case.

18. The circuit housing of claim 1, wherein the cross section which is formed by the two spreading fingers with one another in a contact region with the further hole is substantially elliptical, and wherein contact is then made with the radially inner circumferential face of the further hole at a major axis of the ellipse in a spherical region in a line or at a point.

* * * * *